(12) United States Patent
Ribo et al.

(10) Patent No.: US 10,063,365 B1
(45) Date of Patent: Aug. 28, 2018

(54) RE-TIMER NETWORK INSERTION

(71) Applicant: Keyssa Systems, Inc., Campbell, CA (US)

(72) Inventors: Jerome Jean Ribo, San Jose, CA (US); Bruno Tourette, Cupertino, CA (US)

(73) Assignee: Keyssa Systems, Inc., Campbell, CA (US)

( * ) Notice: Subject to any disclaimer, the term of this patent is extended or adjusted under 35 U.S.C. 154(b) by 0 days.

(21) Appl. No.: 15/455,485

(22) Filed: Mar. 10, 2017

(51) Int. Cl.
  *H04L 7/00* (2006.01)
  *H03L 7/18* (2006.01)
  *H03L 7/091* (2006.01)
  *H03L 7/081* (2006.01)

(52) U.S. Cl.
  CPC ............ *H04L 7/005* (2013.01); *H03L 7/0812* (2013.01); *H03L 7/091* (2013.01); *H03L 7/18* (2013.01); *H04L 7/0037* (2013.01); *H04L 7/0079* (2013.01)

(58) Field of Classification Search
  CPC .............................. H04L 7/005; H04L 7/0041
  USPC .................................................. 375/371, 372
  See application file for complete search history.

(56) References Cited

U.S. PATENT DOCUMENTS

| 5,119,406 A | 6/1992 | Kramer |
| 5,594,762 A * | 1/1997 | Joo ........................ H03K 5/135 327/161 |
| 7,349,509 B2 | 3/2008 | Ribo et al. |
| 2008/0192873 A1 | 8/2008 | Tamura |

* cited by examiner

*Primary Examiner* — David S Huang
(74) *Attorney, Agent, or Firm* — Fish & Richardson P.C.

(57) ABSTRACT

Methods, systems, and apparatus for inserting a re-timer signal between a transmitter and a receiver, including receiving, from the transmitter, an input data signal having encoded words, where each encoded word of the encoded words has a word length of a predetermined number of bits; generating, by a re-timer and based on the input data signal, a regenerated clock signal and an output data signal; determining, based on the regenerated clock signal, a timing difference between the input data signal and the output data signal of the re-timer; and applying, by the re-timer and based on the timing difference between the input data signal and the output data signal, a delay to the input data signal to generate a delayed output data signal, such that a timing difference between the input data signal and the delayed output data signal corresponds to N word lengths.

21 Claims, 5 Drawing Sheets

RE-TIMER NETWORK INSERTION

BACKGROUND

This specification relates to re-timer circuitry for data communications.

When a signal is transmitted from a transmitter to a receiver through an optical, wireless, electrical, or any other types of links, noises such as jitters may be added to the signal during the transmission. The data bit error rate may increase and the performance of the link may suffer as the result. A re-timer may be inserted between the transmitter and the receiver to cancel part of the jittery signal and to release the "cleaned" signal to the receiver, allowing the signal to travel longer and/or to reach the end point with an improved bit error rate. However, when the re-timer is inserted, a word alignment at the receiver may be lost due to a latency associated with the re-timer. For example, in an 8b10b encoding, the word length of each word is 10 bits. If the received signal is delayed by 12 bits after the re-timer insertion, the word will be misaligned at the receiver.

Conventionally, to ensure that words are aligned at the receiver, a word alignment process may start after the re-timer is asserted in the link. The processing of the transmitted data will be delayed until the word alignment process is complete. The end user may thus experience a delay due to the deferral of the world alignment process, which yields a loss in data bandwidth.

SUMMARY

In general, one innovative aspect of the subject matter described in this specification can be embodied in methods, systems, and apparatuses that include receiving, from the transmitter, an input data signal having encoded words, where each encoded word of the encoded words has a word length of a predetermined number of bits; generating, by a re-timer and based on the input data signal, a regenerated clock signal and an output data signal; determining, based on the regenerated clock signal, a timing difference between the input data signal and the output data signal of the re-timer; and applying, by the re-timer and based on the timing difference between the input data signal and the output data signal, a delay to the input data signal to generate a delayed output data signal, such that a timing difference between the input data signal and the delayed output data signal corresponds to N word lengths, where N is an integer equal to or greater than one.

Implementations may include one or more of the following features. To determine the timing difference between the input data signal and the output data signal of the re-timer, a clock word signal having a predetermined period may be generated based on the regenerated clock signal. The clock word signal may be provided to a data input of the re-timer to generate an output clock word signal. The clock word signal and the output clock word signal may be compared by a phase comparator to determine a phase difference between the clock word signal and the output clock word signal.

To generate the clock word signal having the predetermined period, the regenerated clock signal may be provided to a frequency divider to generate the clock word signal, where the predetermined period is an integer-multiple of a period of the regenerated clock signal. To provide the clock word signal to the data input of the re-timer, the clock word signal to be provided to the data input of the re-timer may be selected by a first multiplexer having the clock word signal and the input data signal as inputs. To apply the delay to the input data signal to generate the delayed output data signal, the delay that compensates the phase difference between the clock word signal and the output clock word signal may be determined. The input data signal to be provided to the data input of the re-timer may be selected by the first multiplexer. The delay to the input data signal may be applied to generate the delayed output data signal.

The predetermined period may be an integer-multiple of the word length. After applying the delay to the input data signal to generate the delayed output data signal, the delayed output data signal to be provided to the receiver may be selected by a second multiplexer having the input data signal and the delayed output data signal as inputs.

To apply the delay to the input data signal to generate the delayed output data signal, the input data signal may be stored by an elastic buffer. The stored input data signal may be outputted, by the elastic buffer and based on the delay, as the delayed output data signal. The regenerated clock signal and the delayed output data signal may be outputted by the re-timer.

A protocol preamble used to encode the input data signal may be determined. To apply the delay to the input data signal, the delay to the input data signal may be applied based on the protocol used to encode the input data signal. The input data signal may be encoded based on an 8b/10b encoding scheme, a 64b/66b encoding scheme, or an 128b/130b encoding scheme.

Advantageous implementations may include one or more of the following features. Since there is no delay in the word alignment process when inserting the re-timer to the link, the data bandwidth of the link may improve. The data arriving at the end user is always word aligned with or without the re-timer insertion. A re-timer tracks and removes jitters created during data transmission. Setting the latency to a precise value just before the re-timer insertion to the traffic may allow to control the inter-channel skew for data transmission involving more than one channel.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like reference symbols in the various drawings indicate like elements.

DETAILED DESCRIPTION

This specification describes a re-timer for providing a seamless insertion of the re-timed data in a data link. In particular, this specification describes a re-timer that dynamically determines a latency introduced by the insertion of the re-timer, and generates a delay to the re-timer data output signal, such that the data received by the receiver would remain word-aligned after the re-timer insertion. The process enables a seamless connection of the re-timer to the network, for the end-point user, without loss of word synchronization.

The re-timer architecture described in this specification may be used in wired communications, wireless communications, and/or contactless communications. Wired communications may include signal communications between components on a device, between devices, or between systems using electrical or optical cables. Wireless and contactless communications may include signal communications between components on a device, between devices, or between systems without the use of cables. For example, tightly-coupled transmitter/receiver pairs may be deployed with a transmitter disposed at a terminal portion of a first conduction path and a receiver disposed at a terminal portion of a second conduction path.

Figure 1:
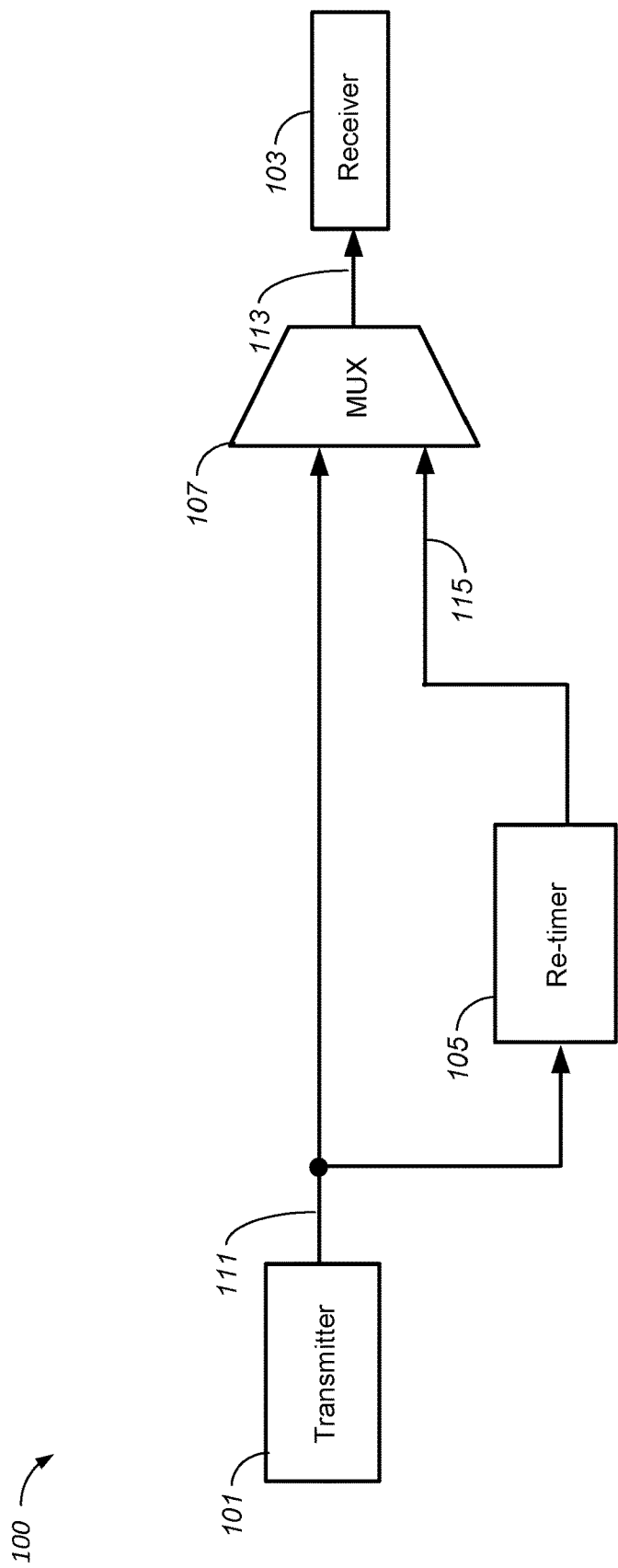
FIG. 1 is a block diagram of an example data link.

FIG. 1 shows an example data link 100. The data link 100 includes a transmitter 101, a re-timer 105, a multiplexer 107, and a receiver 103. The transmitter 101 may be circuitry, a module, a component, a device, a system, or any suitable apparatus that is configured to transmit an input signal 111. In some implementations, the input signal 111 may include a data signal without a reference clock signal. In some other implementations, the input signal 111 may include both a data signal and a reference clock signal for sampling the data signal. In some implementations, the transmitter 101 may include an encoder that encodes the data in the input signal 111. For example, the data may be encoded by an 8b10b encoding scheme, where each 8-bit coded word is encoded with a corresponding 10-bit coded word by an encoder.

The re-timer 105 is configured to receive the input signal 111 from the transmitter 101, and to generate a re-timer signal 115. The received input signal 111 may be affected by noises such as jitters, and the re-timer 105 may be configured to cancel part of the jittery signal and to generate the re-timer signal 115 having lower or no jitters. The re-timer signal 115 may include both a data signal and a reference clock signal for sampling the data signal. In some implementations, the re-timer 105 receives a data signal without a reference clock signal, and generates the reference clock signal based on the received data signal. In some other implementations, the re-timer 105 receives both a data signal and a reference clock signal, and generates a clean data signal and a clean reference clock signal for sampling the clean data signal.

The multiplexer 107 is configured to select a signal from the input signal 111 or the re-timer signal 115, and to output an output signal 113 to the receiver 103. In some implementations, the multiplexer 107 selects the input signal 111 or the re-timer signal 115 based on a quality of the input signal 111. For example, the multiplexer 107 may be initialized to select the input signal 111 for the receiver. As time passes, jitters may be introduced during transmission of the input signal 111 due to factors such as an interference with another signal or changes in the transmission environment. If a predetermined condition is satisfied, the multiplexer 107 may switch from the input signal 111 to the re-timer signal 115. For example, if the data bit error rate at the receiver 103 exceeds a threshold, the multiplexer 107 may switch from the input signal 111 to the re-timer signal 115 to reduce the bit error rate of the data received at the receiver 103. Another example may be a data rate change, from a lower rate to a higher data rate, in the transmission requiring the re-timer path to be activated.

The receiver 103 may be circuitry, a module, a component, a device, a system, or any suitable apparatus that is configured to receive and to process the output signal 113. In some implementations, the receiver 103 may include a decoder that decodes the data in the output signal 113. In some implementations, the receiver 103 may include a bit error rate detector that determines a bit error rate associated with the detection of the output signal 113. In some implementations, the receiver 103 may include a clock recovery having a local clock reference to help setting/calibrating the receiver frequency close to the sender frequency. In some other implementations, the receiver 103 may not include a clock recovery having a local clock reference, and the receiver 103 may rely on a clock signal extracted from the input signal 111 or the re-timer 105 to set or to calibrate the receiver frequency close to the sender frequency.

In general, to seamlessly keep the word alignment before and after the re-timer insertion, the re-timer 105 may add a delay to the re-timer signal 115. For example, the re-timer 105 may cause a latency of twelve-bits. If no delay is introduced, this latency affects the word alignment at the receiver 103 after the re-timer signal 115 is selected by the multiplexer 107. For example, initially the multiplexer 107 may be controlled to select the input signal 111. After an initial word alignment process, the receiver 103 may be word-aligned. After a sudden increase in bit error rate at the receiver 103, the multiplexer 107 may be controlled to switch from the input signal 111 to the re-timer signal 115. If the re-timer signal 115 is delayed with respect to the input signal 111 by two bits, the received coded words at the receiver 103 would be misaligned by two bits, and the communications between the transmitter 101 and the receiver 103 would be interrupted until another word alignment process is performed.

To address this problem, before the multiplexer 107 switches from the input signal 111 to the re-timer signal 115, the re-timer 105 may be configured to apply an additional delay to the re-timer signal 115, such that a latency between the input signal 111 and the delayed re-timer signal 115 is one or more word-lengths. For example, if the re-timer signal 115 is delayed with respect to the input signal 111 by two bits, the re-timer 105 may add an 8-bit delay to the re-timer signal 115, such that the delayed re-timer signal 115 is delayed with respect to the input signal 111 by 10 bits, corresponding to one word-length.

As another example, for an encoding scheme such as 8b10b that has a running disparity, if the re-timer signal 115 is delayed with respect to the input signal 111 by twelve bits, the re-timer 105 may add an 8-bit delay to the re-timer signal 115, such that the delayed re-timer signal 115 is delayed with respect to the input signal 111 by 20 bits, corresponding to two word-lengths to preserve the running disparity. Accordingly, when the multiplexer 107 switches from the input signal 111 to the delayed re-timer signal 115, the received signal 113 at the receiver 103 remains word-aligned.

Figure 2:
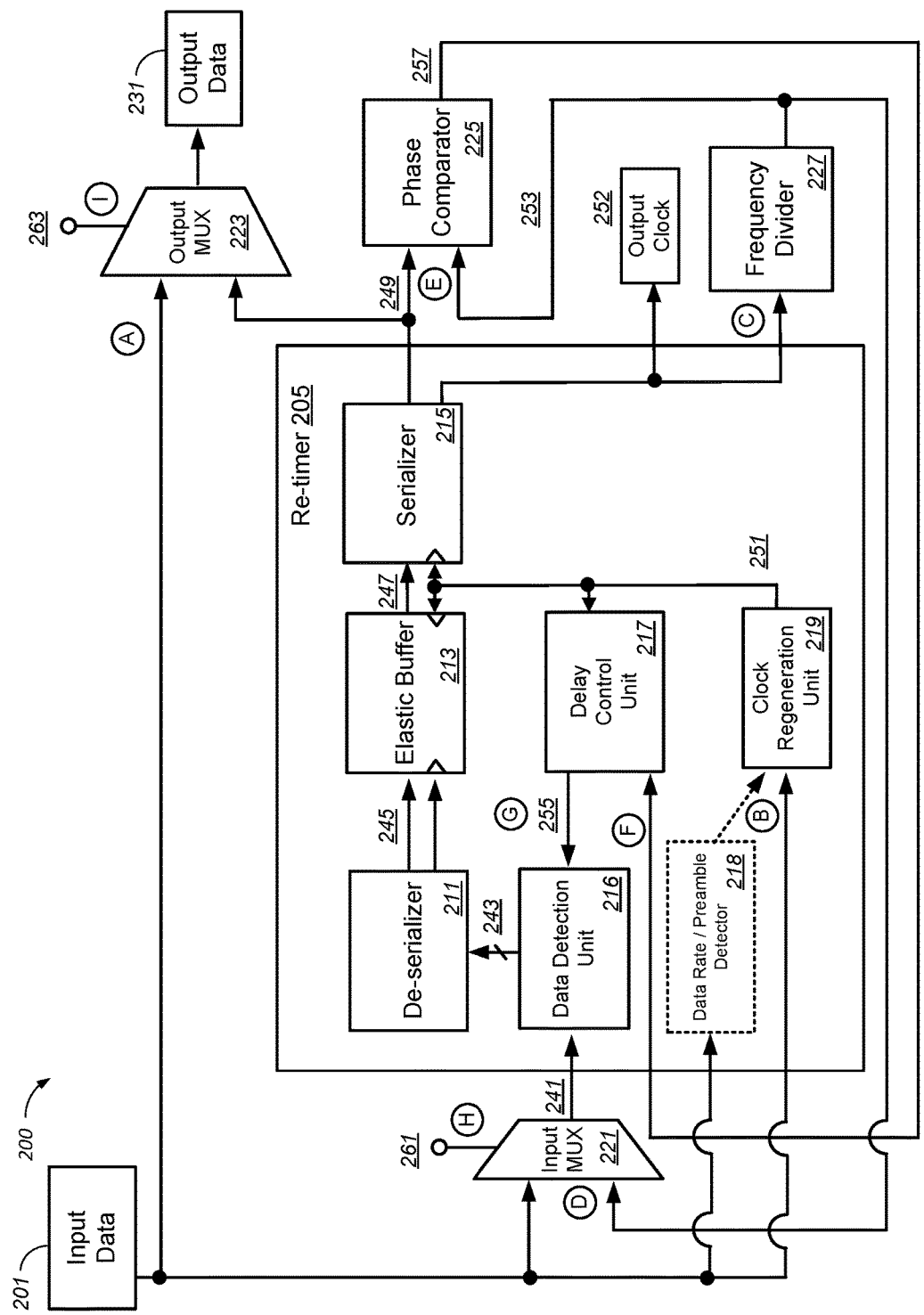
FIG. 2 is a block diagram of an example system that performs a re-timer insertion function.

FIG. 2 shows an example system 200 for performing a re-timer insertion function. The system 200 includes an input multiplexer 221, a re-timer 205, an output multiplexer 223, a phase comparator 225, and a frequency divider 227. In general, a transmitter (e.g., the transmitter 101) may transmit an input data signal 201 to a receiver (e.g., the receiver 103). If re-timer insertion is not required, an output multiplexer 223 may select the input data signal 201 and output an output data signal 231 to the receiver.

If re-timer insertion is required, the input multiplexer 221 may select the input data signal 201 to provide a data signal 241 to the re-timer 205. The re-timer 205 receives the data signal 241, and generates a re-timer data signal 249. The output multiplexer 223 may select the re-timer data signal 249 to insert the re-timer 205 between the transmitter and the receiver. As described in more details below, a combination of the phase comparator 225 and the frequency divider 227 determine a latency associated with the re-timer data signal 249 that is generated by the re-timer 205 with respect to input data signal 201. A delay may be applied to the re-timer 205 to compensate for the latency, such that the re-timer 205 may be seamlessly inserted between the transmitter and the receiver without word misalignment.

The re-timer 205 includes a clock regeneration unit 219, a data detection 216, a de-serializer 211, an elastic buffer 213, a serializer 215, and a delay control 217. In some implementations, the re-timer 205 may include a data rate/preamble detector 218.

In general, the clock regeneration unit 219 includes circuitry that is configured to regenerate a clean output clock signal 251 based on the received input data signal 201. The output clock signal 251 may be used to sample the input data 201, via the delay control unit 217, inside the data detection unit 216. The delay control unit and its clock output 255 may also be used to control the latency associated with the re-timer 205. The output clock signal 252 may be provided to a receiver to re-sample the output data 231. An example of the clock regeneration unit 219 is a clock regeneration loop as described in U.S. patent application Ser. No. 15/097,069, titled "MULTI-PROTOCOLS AND MULTI-DATA RATES COMMUNICATIONS," the contents of which are herein incorporated by reference.

In some implementations, if the data rate and the data protocol of the input data signal 201 are pre-configured in the re-timer 205 prior to receiving the input data signal 201, the clock regeneration unit 219 may regenerate an output clock signal 251 upon receiving the input data 201. For example, if the re-timer 201 is pre-configured to receive data from a transmitter at 5 Gbps, the clock regeneration unit 219 may regenerate an output clock signal 251 that samples data at 5 Gbps.

The data rate/preamble detector 218 includes circuitry that is configured to determine the data rate and the data preamble of the input data signal 201. In some implementations, the data rate/preamble detector 218 is configured to determine the data rate or the data preamble of the input data signal 201 based on one or more characteristics of the input data signal 201. The data rate/preamble detector 218 may be configured to determine the data rate and/or the data preamble of the input data signal 201 based on the edge count of the data within a specific period of time.

The data detection unit 216 includes circuitry configured to determine one or more phase points for sampling the input data signal 201 to generate sampled data 243. An example of the data detection unit 216 is a data detection loop as described in U.S. patent application Ser. No. 15/097,069, titled "MULTI-PROTOCOLS AND MULTI-DATA RATES COMMUNICATIONS." In some implementations, the data detection unit 216 is configured to receive the input data signal 201 and the output clock signal 255 as inputs, and to determine the one or more phase points. The one or more phase points can be determined by comparing a phase difference between the input data signal 201 and a phase delayed image of the output clock signal 251.

For example, jitters may vary over time in the input data signal 201, and the data detection unit 216 may compare a current leading edge of the input data signal 201 and a leading edge of the phase delayed output clock signal 251 to determine a phase difference between the input data signal 201 and the phase delayed output clock signal 251. The data detection unit 216 may determine one or more updated phase points for sampling the input data signal 201 based on the comparison.

The de-serializer 211 includes circuitry configured to receive a serialized data signal 243 and to generate a de-serialized data signal 245.

The elastic buffer 213 includes circuitry configured to receive the de-serialized data signal 245 and to generate a buffered data signal 247. The elastic buffer 213 may be implemented as a pipelined first-in-first-out (FIFO) buffer. Since the clock regeneration unit 219 and the data detection unit 216 are two distinct clock domains, the clock going through each unit may have a phase difference.

In some implementations, the elastic buffer 213 is configured to offset the phase difference between the output clock signal 251 and the sampled data 243, and to generate the buffered data signal 247 where the phase difference is compensated. In some implementations, the elastic buffer 213 is configured to provide a delay to compensate a latency between the input data signal 201 and the re-timer data signal 249. The delay may be controlled by the delay control unit 217.

The serializer 215 includes circuitry configured to receive a de-serialized buffered data signal 247 and to generate a serialized data signal 249. For example, the serializer 215 may be a serializer that serializes the received data from parallel data busses into a single serial output data bus.

The frequency divider 227 includes circuitry configured to receive the output clock signal 252 and to generate a divided clock signal 253. The period of the divided clock signal 253 may be an integer multiple of the period of the output clock signal 252. For example, if the period of the output clock signal 252 is 1 bit-length, the period of the divided clock signal 253 may be 2 bit-lengths, 4 bit-lengths, 10 bit-lengths, or any other bit-lengths that is appropriate for an encoding scheme. For the 8b10b encoding scheme, the period of the output clock signal 252 may be 1 bit-length, and the period of the divided clock signal 253 may be 20 bit-lengths, which is twice the 10-bit word-length to preserve the running disparity of the encoding. The 20 bit-lengths divided clock signal 253 may be called a "clock word" because the 20 bit-lengths divided clock signal 253 corresponds to two words (i.e., a positive disparity and a negative disparity) encoded using the 8b10b encoding scheme.

The phase comparator 225 includes circuitry configured to receive the re-timer data signal 249 and the divided clock signal 253 and to determine a phase difference between the re-timer data signal 249 and the divided clock signal 253. In some implementations, the phase difference may be converted to a latency associated with the re-timer 205. For example, the clock word may be provided to the data input of the re-timer 205. The various processing stages of the re-timer 205 may introduce a latency between the data input and the data output of the re-timer 205. By comparing the phase difference between the input clock word (i.e., the divided clock signal 253) and the output clock word (i.e., the re-timer data signal 249), the phase comparator 225 or another circuitry may generate directives to reduce the phase difference and therefore adjusting the latency to the desired word length.

The delay control unit 217 includes circuitry configured to receive a latency data signal 257 representing a latency between the data input and the data output of the re-timer 205, and to generate a delayed clock 255 of the clock 251 that re-aligns any word misalignment caused by the latency, In the re-timer mode of operation the delay control unit 217 provides the delayed clock to adjust the phase to the incoming data. to the elastic buffer 213 keep, in average, the latency constant to where it has been set during the word alignment.

The input multiplexer 221 includes circuitry configured to receive the input data signal 201 and the divided clock signal 253 as inputs, and to select, based on an input multiplexer control signal 261, one of the input data signal 201 or the divided clock signal 253 as a multiplexer output 241.

The output multiplexer 223 includes circuitry configured to receive the input data signal 201 and the re-timer data signal 249 as inputs, and to select, based on an output multiplexer control signal 263, one of the input data signal 201 or the re-timer data signal 249 as the output data 231.

FIG. 2 also illustrates an example flow of data, shown in states (A) to (I). States (A) to (I) may occur in the illustrated sequence, or they may occur in a sequence that is different than in the illustrated sequence.

During state (A), a transmitter sends the input data signal 201 to a receiver using a communication link. The output multiplexer 223 is configured to select, based on the output multiplexer control signal 263, the input data signal 201 as the output data signal 231 to be provided to the receiver without an insertion of the re-timer 205. Here, the input data signal 201 is encoded using an 8b10b encoding scheme, where each word has a word-length of 10 bits. A word alignment process may be performed between the transmitter and the receiver, such that the receiver may decode the received data.

During state (B), an event may trigger a re-timer insertion. For example, the receiver may determine that the data bit error rate at the receiver has exceeded a threshold, which triggers the insertion of the re-timer 205 to the link. The clock regeneration unit 219 is configured to receive the input data signal 201 and generate an output clock signal 251. In some implementations, the data rate/protocol detector 218 receives the input data signal 201 and determines the data rate and/or the protocol of the input data signal 201. Here, the clock regeneration unit 219 generates the output clock signal 251 having a period that corresponds to 1 bit.

During state (C), the frequency divider 227 receives the output clock signal 251 and generates a divided clock signal 253. Here, the frequency divider 227 receives the output clock signal 251 having a period of 1-bit, and generates a clock word, which is the divided clock signal 253 having a period of 20-bit that preserves the running disparity of the 8b10b encoding.

During state (D), the input multiplexer control signal 261 selects the clock word (i.e., the divided clock signal 253) as the data input of the re-timer 205.

During state (E), the re-timer 205 processes the clock word and generates an output clock word (i.e., the re-timer data signal 249). The output clock word is provided to the phase comparator 225, where the phase comparator 225 compares the output clock word (i.e., the re-timer data signal 249) with the input clock word (i.e., the divided clock signal 253) to determine a latency of the re-timer 205. Here, the phase comparator 225 may determine that a 12 bit-length latency is introduced by the re-timer 205.

During state (F), the phase comparator 225 provides a latency data signal 257 to the delay control unit 217, where the delay control unit 217 adjust the delay to compensate the latency of the re-timer 205. Here, the delay control unit 217 is configured to preserve the word alignment, including the running disparity, between the transmitter and the receiver, a delay of 18 bit-lengths is required.

During state (G), the delay control unit 217 provides a delay clock 255 to the elastic buffer 213 to introduce a delay of 8 bit-lengths.

During state (H), the input multiplexer control signal 261 selects the input data signal 201 as the data input of the re-timer 205. The re-timer 205 generates a clean re-timer data signal 249 and a clean output clock signal 251, where the re-timer data signal 249 is delayed by 20 bit-lengths to preserve word alignment between the transmitter and the receiver.

During state (I), the output multiplexer control signal 263 selects the clean re-timer data signal 249 as the output data signal 231 to the receiver. Since the re-timer data signal 249 and the input data signal 201 are offset by two word-lengths (i.e., 20 bit-lengths), the receiver may process the re-timer data signal 249 without needing to perform a word alignment process again.

Figure 3A:
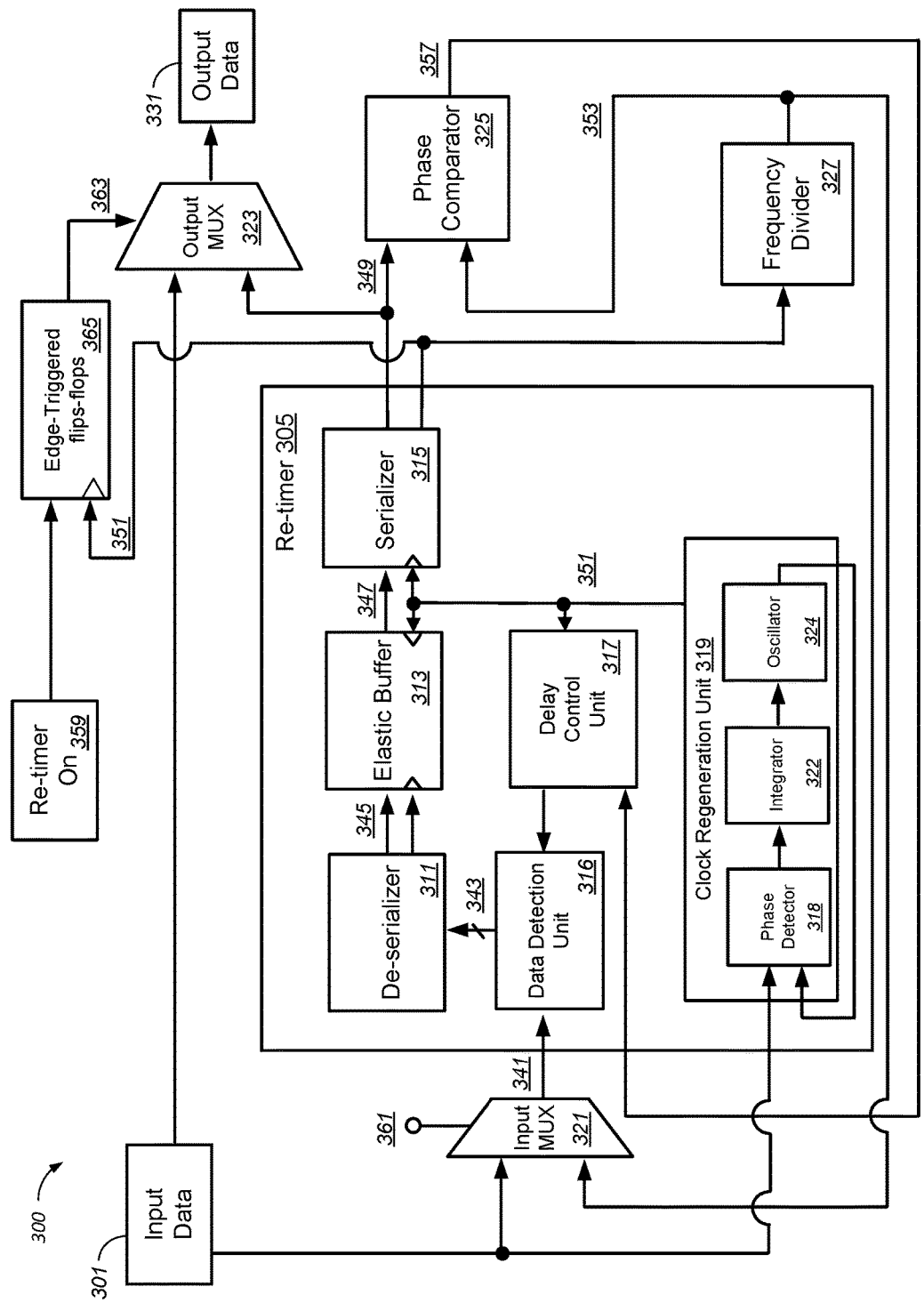
FIG. 3A is a block diagram of an example system that performs a re-timer insertion function emphasizing the phase alignments matching feature.

FIG. 3A shows an example system 300 for performing a synchronized re-timer insertion function. The system 300 includes an input multiplexer 321, a re-timer 305, an output multiplexer 323, a phase comparator 325, a frequency divider 327, and an edge-triggered flip-flop 365. The input multiplexer 321, the re-timer 305, the output multiplexer 323, the phase comparator 325, and the frequency divider 327 are similar to the corresponding components described in FIG. 2.

The edge-triggered flip-flop 365 includes circuitry configured to receive a "re-timer on" signal 359 and the output clock signal 351, and to release the "re-timer on" signal 359 on a rising edge or a falling edge of the output clock signal 351. The edge-triggered flip-flop 365 allows the "re-timer on" signal 359 to be inserted asynchronously, while preserving the synchronicity of the transmission by switching the selection of inputs of the output multiplexer 323 only on a rising edge or a falling edge of the output clock signal 351.

The re-timer 305 includes a clock regeneration unit 319, a data detection 316, a de-serializer 311, an elastic buffer 313, a serializer 315, and a delay control 317. The data detection 316, the de-serializer 311, the elastic buffer 313, the serializer 315, and the delay control 317 are similar to the corresponding components described in FIG. 2.

The clock regeneration unit 319 of the re-timer 305 includes a phase detector 318, an integrator 322, and an oscillator 324. The phase detector 318, the integrator 322, and the oscillator 324 form a clock regeneration loop for adjusting the output clock signal 351, such that the output clock signal 351 is in phase with the input data signal 301. The clock regeneration loop, including the phase detector 318, the integrator 322, and the oscillator 324 may behave similar to a low-pass filter that filters out high-frequency jitters over time.

The phase detector 318 is configured to determine a phase difference between the output clock signal 351 and the input data signal 301. For example, the phase detector 318 may be a bang-bang phase detector, a phase frequency detector, an analog multiplier phase detector, a binary phase detector, an oversampling phase detector, or any other suitable phase detectors that may perform the function of phase detection.

The integrator 322 is configured to determine an average phase difference based on the phase difference and an accumulated phase difference. Based on the average phase difference, the integrator 322 may be configured to generate a clock regeneration control signal to adjust the frequency of the output clock signal 351 generated by the oscillator 324, such that the output clock signal 351 may be adjusted according to jitters that occur over time in the input data signal 301 while maintaining a clean signal.

The oscillator 324 may be an electronic oscillator that is controlled by a control signal to generate a clock output having an oscillation frequency. For example, if the oscillator 324 is a voltage controlled oscillator (VCO), the oscillation frequency is determined by an applied voltage control.

Figure 3B:
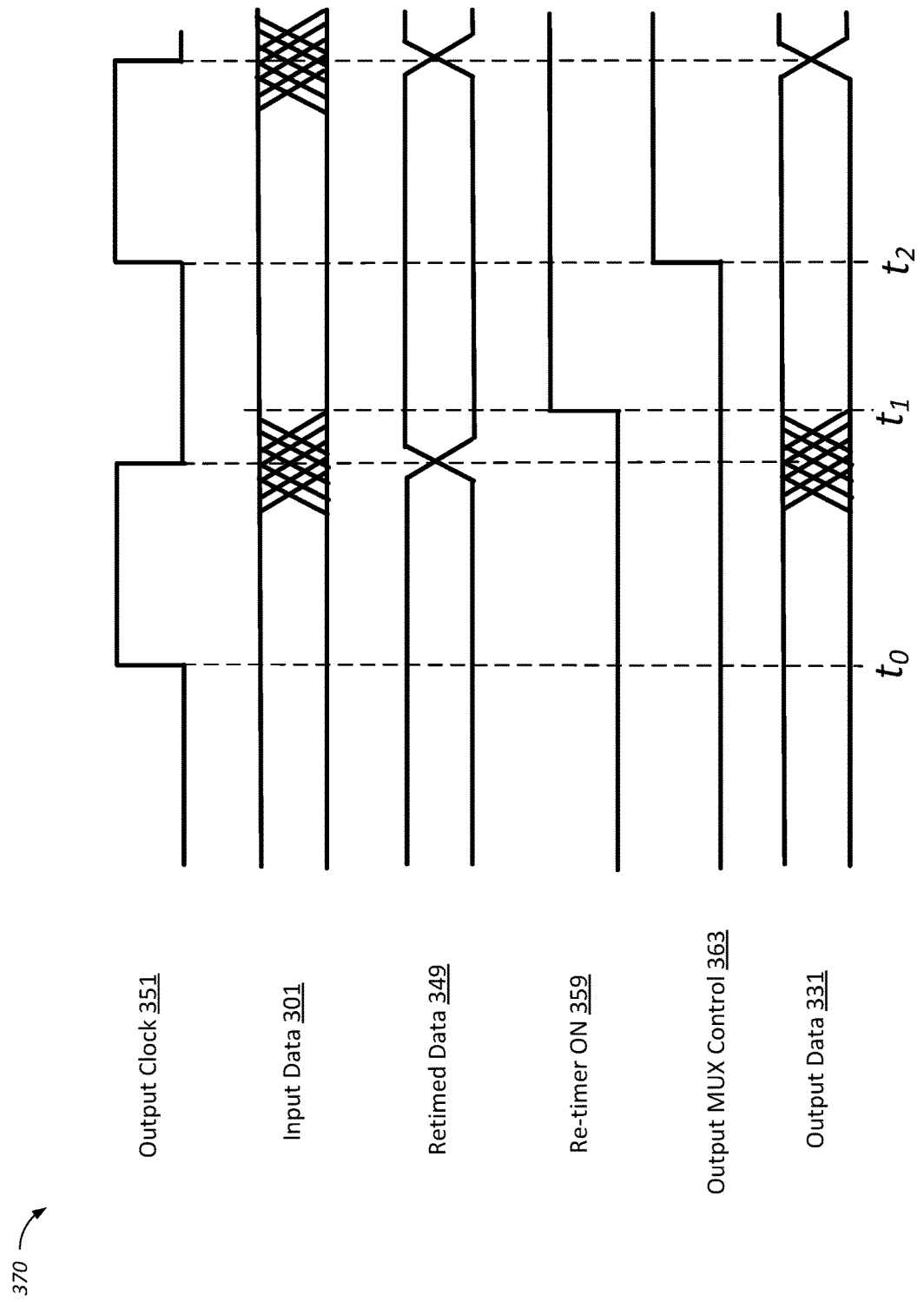
FIG. 3B is an example timing diagram.

FIG. 3B is one example timing diagram 370 for the system 300 illustrating a synchronized re-timer insertion. The timing diagram 370 illustrates an output clock signal 351, an input data signal 301, a re-timed data output 349, a "re-timer on" signal 359, an output multiplexer control signal 363, and the resulting output data 331, each with respect to time. At time t0, a transition in the input data signal 301 occurs. Since the clock regeneration unit 319 locks the phase of the output clock signal 351 with the input data signal 301, FIG. 3B shows that the edge transition of the output clock signal 351 occurs synchronously with the input data signal 301. In consequence the re-timed output data 349 aligned to the output clock 351 is aligned to the incoming data 301. At time the "re-timer on" signal 359 is enabled. The "re-timer on" signal 359 may be enabled because the data bit error rate at the receiver exceeds a threshold. However, the output multiplexer control signal 363 remains disabled (i.e., the input data signal 301 is selected) until time t2, where the rising edge transition of the output clock signal 351 occurs. After the output multiplexer control signal 363 is enabled, the re-timer data signal 349 is selected by the output multiplexer 323 to ensure a smooth and controlled transition observed in the output data 331.

Figure 4:
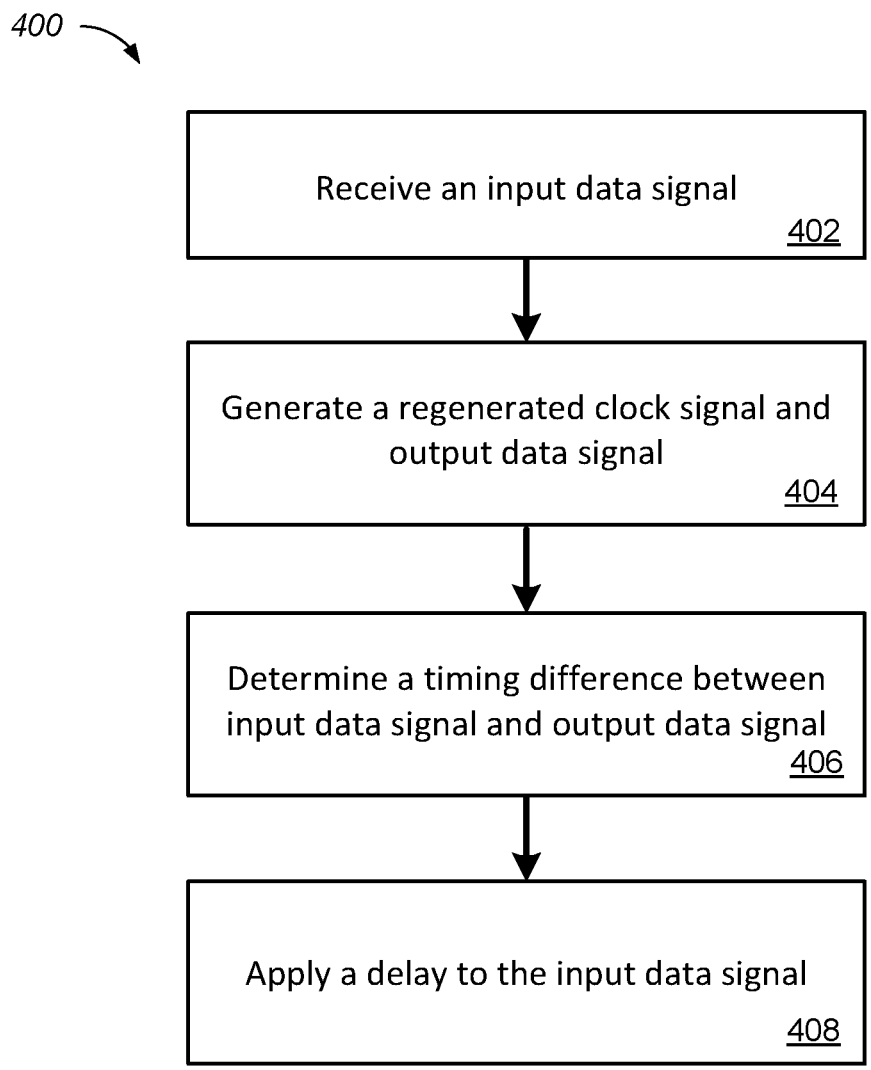
FIG. 4 is a flow diagram that illustrates an example of a process for inserting a re-timer to a link.

FIG. 4 is a flow diagram that illustrates an example of a process 400 for inserting a re-timer to a link. The process 400 may be performed by a system, for example the system 200 or the system 300 described above.

The system receives, from the transmitter, an input data signal having encoded words, where each encoded word of the encoded words has a word length of a predetermined number of bits (402). For example, the re-timer 205 may receive an input data signal 201, where the input data signal 201 may be encoded using an 8b10b encoding scheme, where each encoded word has a word length of 10 bits. In some implementations, the input data signal may be encoded based on an 8b/10b encoding scheme, a 64b/66b encoding scheme, or an 128b/130b encoding scheme.

The system retrieves, based on the input data signal, a regenerated clock signal (404). For example, the clock regeneration unit 219 may be configured to receive the input data signal 201 and generate an output clock signal 251.

The system determines, based on the regenerated clock signal, a timing difference between the input data signal and the output data signal of the re-timer (406). For example, the phase comparator 225 may compare the re-timer data signal 249 with the divided clock signal 253 to determine a latency of the re-timer 205. To determine a timing difference, the system may generate, based on the regenerated clock signal, a clock word signal having a predetermined period. In some implementations, the predetermined period is an integer-multiple of the word length.

In some implementations, to generate the clock word signal, the system provides the regenerated clock signal to a frequency divider to generate the clock word signal, where the predetermined period is an integer-multiple of a period of the regenerated clock signal. For example, the frequency divider 227 may receive the output clock signal 251 having a period of 1-bit, and generate a clock word, which is the divided clock signal 253 having a period of 20-bits that preserves the running disparity of the 8b10b encoding. The clock word has a period of 20-bits that corresponds to two times of the word length of 10-bits.

The system may provide the clock word signal to a data input of the re-timer to generate an output clock word signal. In some implementations, to provide the clock word signal to the data input of the re-timer, the system selects, using a first multiplexer having the clock word signal and the input data signal as inputs, the clock word signal to be provided to the data input of the re-timer. For example, the input multiplexer control signal 261 may select the clock word (i.e., the divided clock signal 253) as the data input of the re-timer 205.

The system may compare the clock word signal and the output clock word signal to determine a phase difference between the clock word signal and the output clock word signal. For example, the phase comparator 225 may compare the output clock word (i.e., the re-timer data signal 249) with the input clock word (i.e., the divided clock signal 253) to determine a phase difference that corresponds to a latency of the re-timer 205.

The system applies, based on the timing difference between the input data signal and the output data signal, a delay to the input data signal to generate a delayed output data signal, such that a timing difference between the input data signal and the delayed output data signal corresponds to N word lengths, where N is an integer equal to or greater than one (408). For example, the delay control unit 217 may provide a delay control signal 255 to the elastic buffer 213 to introduce a delay that compensates the word misalignment due to the latency of the re-timer 205.

In some implementations, the system determines a protocol used to encode the input data signal. To apply the delay to the input data signal, the system may apply the delay to the input data signal based on the protocol used to encode the input data signal. For example, the data rate/protocol detector 218 may receive the input data signal 201 and determine the data rate and/or the protocol of the input data signal 201. The delay control unit 217 may provide a delay control signal 255 to the elastic buffer 213 according to the protocol used to encode the input data signal.

In some implementations, to apply the delay to the input data signal to generate the delayed output data signal, the system determines the delay that compensates the phase difference between the clock word signal and the output clock word signal. The system may select, using the first multiplexer, the input data signal to be provided to the data input of the re-timer. The system may apply the delay to the input data signal to generate the delayed output data signal. For example, after the phase comparator 225 determines that a 12 bit-length latency is introduced by the re-timer 205, the input multiplexer control signal 261 may select the input data signal 201 as the data input of the re-timer 205. The re-timer 205 may generate a clean re-timer data signal 249 and a clean output clock signal 251, where the re-timer data signal 249 is delayed by 8 bit-lengths to preserve word alignment between the transmitter and the receiver.

In some implementations, the system stores, using an elastic buffer, the input data signal. For example, the elastic buffer 213 may store a de-serialized data signal 245. The system may output, using the elastic buffer and based on the delay, the stored input data signal as the delayed output data signal. For example, the delay control unit 217 may provide a delay control signal 255 to the elastic buffer 213 to introduce a delay of 8 bit-lengths. The elastic buffer 213 may output a buffered data signal 247 according to the delay.

In some implementations, after applying the delay to the input data signal to generate the delayed output data signal, the system selects, using a second multiplexer having the input data signal and the delayed output data signal as inputs, the delayed output data signal to be provided to the receiver. For example, the output multiplexer control signal 263 may select the clean re-timer data signal 249 as the output data signal 231 to the receiver.

In some implementations, the system outputs the regenerated clock signal and the delayed output data signal. For example, the system 200 may output the output clock signal 251 and the output data signal 231 to the receiver.

A number of embodiments of the invention have been described. Nevertheless, it will be understood that various modifications may be made without departing from the spirit and scope of the invention. Accordingly, other embodiments are within the scope of the following claims.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for inserting a re-timer signal between a transmitter and a receiver, the method comprising:
    receiving, from the transmitter, an input data signal having encoded words, wherein each encoded word of the encoded words has a word length of a predetermined number of bits;
    generating, by a re-timer and based on the input data signal, a regenerated clock signal and an output data signal;
    determining, based on the regenerated clock signal, a timing difference between the input data signal and the output data signal of the re-timer; and
    applying, by the re-timer and based on the timing difference between the input data signal and the output data signal, a delay to the input data signal to generate a delayed output data signal, such that a timing difference between the input data signal and the delayed output data signal corresponds to N word lengths, wherein N is an integer equal to or greater than one.

2. The method of claim 1, wherein determining the timing difference between the input data signal and the output data signal of the re-timer further comprises:
    generating, based on the regenerated clock signal, a clock word signal having a predetermined period;
    providing the clock word signal to a data input of the re-timer to generate an output clock word signal; and
    comparing, by a phase comparator, the clock word signal and the output clock word signal to determine a phase difference between the clock word signal and the output clock word signal.

3. The method of claim 2, wherein generating the clock word signal having the predetermined period further comprises providing the regenerated clock signal to a frequency divider to generate the clock word signal, wherein the predetermined period is an integer-multiple of a period of the regenerated clock signal.

4. The method of claim 2, wherein providing the clock word signal to the data input of the re-timer further comprises selecting, by a first multiplexer having the clock word signal and the input data signal as inputs, the clock word signal to be provided to the data input of the re-timer.

5. The method of claim 4, wherein applying the delay to the input data signal to generate the delayed output data signal further comprises:
    determining the delay that compensates the phase difference between the clock word signal and the output clock word signal;
    selecting, by the first multiplexer, the input data signal to be provided to the data input of the re-timer; and
    applying the delay to the input data signal to generate the delayed output data signal.

6. The method of claim 2, wherein the predetermined period is an integer-multiple of the word length.

7. The method of claim 1, further comprising:
    after applying the delay to the input data signal to generate the delayed output data signal, selecting, by a second multiplexer having the input data signal and the delayed output data signal as inputs, the delayed output data signal to be provided to the receiver.

8. The method of claim 1, wherein applying the delay to the input data signal to generate the delayed output data signal comprises:
    storing, by an elastic buffer, the input data signal; and
    outputting, by the elastic buffer and based on the delay, the stored input data signal as the delayed output data signal.

9. The method of claim 1, further comprising:
    outputting, by the re-timer, the regenerated clock signal and the delayed output data signal.

10. The method of claim 1, further comprising:
    determining a protocol used to encode the input data signal, and
    wherein applying the delay to the input data signal comprises applying the delay to the input data signal based on the protocol used to encode the input data signal.

11. The method of claim 1, wherein the input data signal is encoded based on an 8b/10b encoding scheme, a 64b/66b encoding scheme, or an 128b/130b encoding scheme.

12. An apparatus for inserting a synchronized signal between a transmitter and a receiver, the apparatus comprising:
a re-timer configured to:
receive, from the transmitter, an input data signal including encoded words, wherein each encoded word of the encoded words has a word length of a predetermined number of bits;
generate, based on the input data signal, a regenerated clock signal and an output data signal; and
apply, based on a timing difference between the input data signal and the output data signal, a delay to the input data signal to generate a delayed output data signal, such that a timing difference between the input data signal and the delayed output data signal corresponds to N word lengths, wherein N is an integer equal to or greater than one; and
a phase comparator configured to:
determine, based on the regenerated clock signal, the timing difference between the input data signal and the output data signal of the re-timer.

13. The apparatus of claim 12, further comprising:
a frequency divider configured to:
receive, from the re-timer, the regenerated clock signal; and
generate, based on the regenerated clock signal, a clock word signal having a predetermined period,
wherein the re-timer is further configured to receive the clock word signal at a data input of the re-timer to generate an output clock word signal,
wherein the phase comparator is configured to determine the timing difference between the input data signal and the output data signal by comparing the clock word signal and the output clock word signal to determine a phase difference between the clock word signal and the output clock word signal.

14. The apparatus of claim 13, wherein the predetermined period is an integer-multiple of a period of the regenerated clock signal.

15. The apparatus of claim 13, further comprising:
a first multiplexer configured to:
receive the clock word signal and the input data signal as separate inputs; and
select the clock word signal to be provided to the data input of the re-timer.

16. The apparatus of claim 15, wherein the re-timer is configured to apply the delay to the input data signal to generate the delayed output data signal by:
determining the delay that compensates the phase difference between the clock word signal and the output clock word signal;
generating a first control signal to the first multiplexer to select the input data signal to be provided to the data input of the re-timer; and
applying the delay to the input data signal to generate the delayed output data signal.

17. The apparatus of claim 13, wherein the predetermined period is an integer-multiple of the word length.

18. The apparatus of claim 12, further comprising:
a second multiplexer configured to:
receive the input data signal and the delayed output data signal as separate inputs; and
after the re-timer applies the delay to the input data signal to generate the delayed output data signal, select the delayed output data signal to be provided to the receiver.

19. The apparatus of claim 12,
wherein the re-timer comprises an elastic buffer, and
wherein the re-timer is configured to apply the delay to the input data signal to generate the delayed output data signal by:
storing, by the elastic buffer, the input data signal; and
outputting, by the elastic buffer and based on the delay, the stored input data signal as the delayed output data signal.

20. The apparatus of claim 12, wherein the re-timer is further configured to:
output the regenerated clock signal and the delayed output data signal.

21. A system comprising:
a communication system configured to receive an input data signal from a transmitter, the communication system including a receiver and a re-timer, wherein the re-timer is configured to:
receive, from the transmitter, an input data signal having encoded words, wherein each encoded word of the encoded words has a word length of a predetermined number of bits;
retrieve, based on the input data signal, a regenerated clock signal and an output data signal;
determine, based on the regenerated clock signal, a timing difference between the input data signal and the output data signal of the re-timer; and
apply, based on the timing difference between the input data signal and the output data signal, a delay to the input data signal to generate a delayed output data signal, such that a timing difference between the input data signal and the delayed output data signal corresponds to N word lengths, wherein N is an integer equal to or greater than one.

* * * * *